United States Patent [19]

Moore

[11] 4,315,228

[45] Feb. 9, 1982

[54] MULTIPLE CO-SURFACE ACOUSTIC WAVE FILTERS

[75] Inventor: Robert A. Moore, Arnold, Md.

[73] Assignee: Westinghouse Electric Corp., Pittsburgh, Pa.

[21] Appl. No.: 165,580

[22] Filed: Jul. 3, 1980

[51] Int. Cl.³ .................... H03H 9/145; H03H 9/42; H03H 9/64; H03H 9/72

[52] U.S. Cl. ........................ 333/193; 310/313 B; 331/107 A; 333/154; 333/196

[58] Field of Search ................... 333/193–196, 333/150–155; 331/107 A, 155, 163; 310/313 R, 313 A, 313 B, 313 C, 313 D; 330/5.5, 1 R, 1 A

[56] References Cited

U.S. PATENT DOCUMENTS

| | | | |
|---|---|---|---|
| 3,736,587 | 5/1973 | Bush et al. | 333/150 X |
| 3,754,192 | 8/1973 | Palfreeman | 330/5.5 |
| 3,831,116 | 8/1974 | Davis, Jr. et al. | 333/193 |
| 3,852,540 | 6/1971 | Adler et al. | 331/107 A X |
| 3,855,548 | 12/1974 | Nandi et al. | 331/107 A |
| 3,855,556 | 12/1974 | Hartmann | 333/193 |
| 4,100,498 | 7/1978 | Alsup et al. | 331/107 A X |

OTHER PUBLICATIONS

Hartmann et al.—"Wideband unidirectional interdigital surface wave transducers", IEEE Transactions on Sonics and Ultrasonics, vol. SU-19, No. 3, Jul. 1972; pp. 378–381.

Primary Examiner—Marvin L. Nussbaum
Attorney, Agent, or Firm—R. M. Trepp

[57] ABSTRACT

Apparatus for providing a plurality of filtered outputs is described incorporating a substrate suitable for propagating surface acoustic waves having an input transducer, a first plurality of spaced-apart taps coupled together, a second plurality of spaced-apart taps coupled together where at least two of the second plurality of taps are positioned in spaces between the first plurality of taps.

The invention overcomes the problem of providing separate substrate surface area for each plurality of taps coupled together.

15 Claims, 14 Drawing Figures

MULTIPLE CO-SURFACE ACOUSTIC WAVE FILTERS

BACKGROUND OF THE INVENTION

1. Field of the Invention

This invention relates to electro-acoustic apparatus, particularly to surface acoustic wave devices.

2. Description of the Prior Art

Surface acoustic wave devices normally utilize a transducer suitable for propagating surface acoustic waves or Rayleigh waves with a transducer at one end of a substrate for launching surface acoustic waves and a transducer position at the other end of the substrate for receiving surface acoustic waves. The transducers convert electrical energy into acoustic wave energy and vice versa. The concomitant use of substrate material for propagation of surface acoustic waves has been suggested in U.S. Pat. No. 3,582,540 issued on June 1, 1971 to Robert Adler where transducers have been positioned on the four sides of a rectangular substrate. Two transducers on two adjacent sides of a substrate launch surface acoustic waves through the central portion of the substrate to a transducer on the opposite side as shown in FIG. 18. The patent states at column 17 that more efficient use of the substrate may be obtained by having different surface acoustic waves crossing one another utilizing a common area for propagation.

The common use of substrate area by interdigital fingers of a three-phase transducer is described by C. S. Hartmann, et al. entitled "Wide-Band Unidirectional Interdigital Surface Wave Transducers" appearing in IEEE Transactions on Sonics and Ultrasonics, Vol. S.U.-19, No. 3, pp. 378-381, July 1972. A three-phase transducer is shown in FIG. 1 comprising three sets of fingers evenly spaced apart and positioned adjacent respective fingers of the other sets. The fingers are interconnected to form three electrode groups which are electrically driven 120 degrees out of phase.

The use of a plurality of transducers on a substrate including switches for selectively coupling a number of transducers to an input or output circuit is described in U.S. Pat. No. 3,831,116 issued on Aug. 20, 1974 to L. Davis, Jr. and M. G. Holland. As shown in FIG. 3 a plurality of spaced-apart transducers are positioned on a substrate. Each transducer is coupled through a switch to either an input or output circuit. The switches may be set as desired to produce a desired arrangement of frequency response peaks from the input to the output. The switchable filter may be used, for example, in a receiver where the switches are set by an operator on the switchable filter to select a desired frequency.

Surface acoustic wave devices have also been fabricated which utilize the propagation time delay of the substrate and frequency response of the taps to form an oscillator having predetermined modes of oscillation dependent upon the time delay of a signal traveling through the device through a feedback amplifier to the input of the surface acoustic wave device. An example of an oscillator incorporating a surface acoustic wave device is shown in U.S. Pat. No. 3,855,548 issuing on Dec. 17, 1974 to A. K. Nandi, et al. A surface acoustic wave device is shown having an input transducer, a propagation path for surface acoustic waves in the substrate and an output transducer having a plurality of output taps coupled together to an output terminal. The plurality of output taps each have an internal structure comprising a few pairs of interdigitated electrodes. The plurality of output taps function to provide a frequency response to provide selected feedback to the input of a surface acoustic wave device. In other words, the output signal as recirculated back through the surface acoustic wave device which will oscillate at preferred frequencies dependent upon the recirculating time delay.

In the prior art, a number of filters utilizing surface acoustic wave devices would each utilize a separate surface acoustic wave substrate area for its filter. For example, to implement a selectable frequency band-pass filter, a number of surface acoustic wave filter devices were shown each on a separate substrate which was described in U.S. Pat. No. 3,855,556 issuing on Dec. 17, 1974. A particular frequency was selected by switching in a filter responsive to the desired frequency.

It is, therefore, desirable to provide for simultaneous use of the same area on a surface acoustic wave substrate for several filters.

It is further desirable that several filters may be fabricated on a surface acoustic wave device for occupying the same area.

It is further desirable that several comb filters be fabricated on a surface acoustic wave device for occupying the same area, each operating independently of the others and having separate concurrent outputs.

It is further desirable to provide a plurality of frequencies, each on a separate output line, selected from an input signal having a comb frequency spectrum.

It is further desirable to provide signal generation means for rapidly switching between frequencies within a predetermined bandwidth determined by a comb frequency spectrum derived from a crystal-controlled oscillator.

It is further desirable to fabricate a surface acoustic wave device which allows for the coexistence of a bank of transducers on the same surface acoustic surface area for selection of individual lines from a comb spectrum and sustaining oscillations of the comb spectrum by appropriate feedback.

SUMMARY OF THE INVENTION

In accordance with the present invention, apparatus is provided for providing a plurality of filtered outputs comprising a substrate having a surface suitable for propagating surface acoustic waves, an input transducer for launching surface acoustic waves in the substrate, a first plurality of spaced-apart taps coupled together for providing a first output signal, a second plurality of spaced-apart taps coupled together for providing a second output signal, at least two of the second plurality of taps positioned in spaces between the first plurality of taps.

The invention further provides apparatus for providing a plurality of frequencies comprising a substrate having a surface suitable for propagating surface acoustic waves, a first transducer positioned on said substrate for launching surface acoustic waves, a second transducer positioned on the substrate for launching surface acoustic waves, a first plurality of spaced-apart taps having spaces for selecting a first frequency coupled together for providing a first output signal, a second plurality of spaced-apart taps having spaces for selecting a second frequency coupled together for providing a second output signal, and at least two of the second plurality of taps positioned in spaces between the first plurality of taps, means for amplifying the first and second output signals, and means for coupling the amplified signals to the input of the second transducer.

DESCRIPTION OF THE PREFERRED EMBODIMENT

Figure 1:
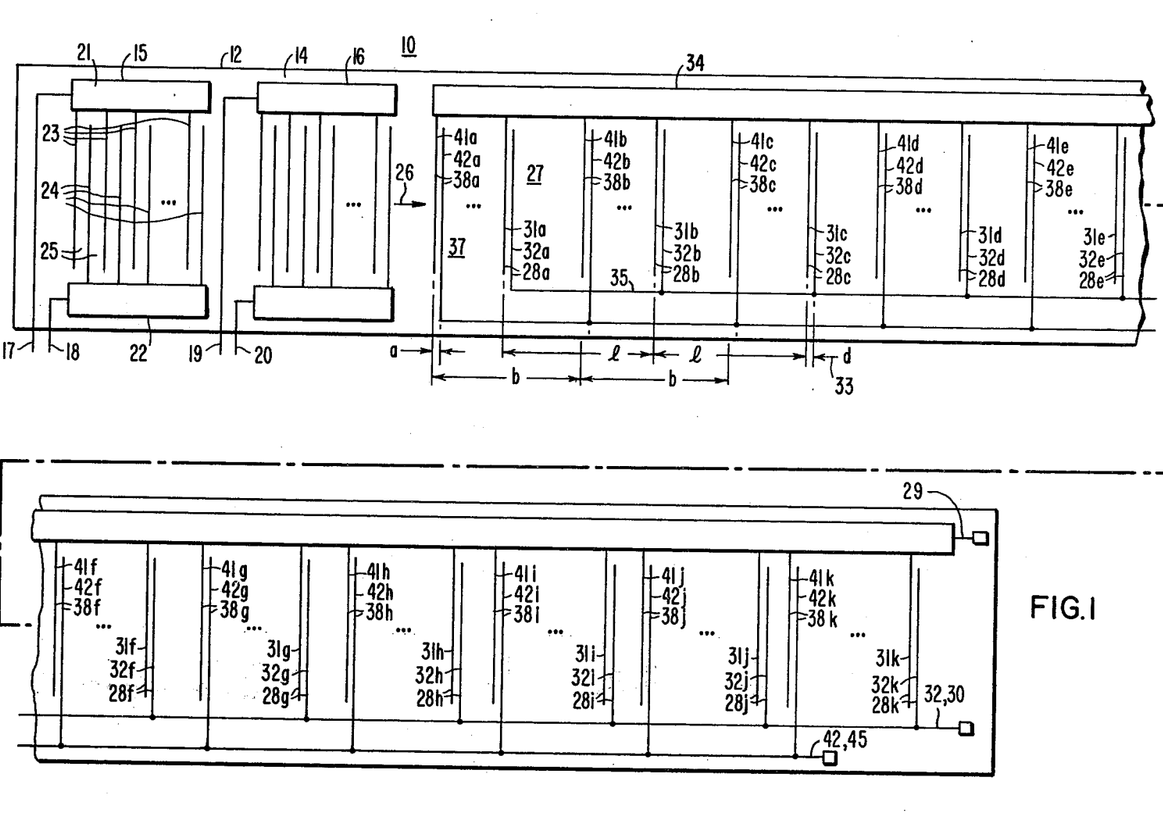
FIG. 1 is a top view of one embodiment of the invention.

Referring now to the drawing and in particular to FIG. 1, a surface acoustic wave device 10 is shown. Surface acoustic wave device 10 has a substrate 12 having a major surface 14 suitable for propagating surface acoustic waves. Substrate 12 may, for example, be quartz, lithium niobate, lithium tantalate or bismuth germanium oxide. Positioned on upper or major surface 14 are input transducers 15 and 16 which function to launch surface acoustic waves in substrate 12. Transducer 15 is coupled over lines 17 and 18 to an input signal. Transducer 16 is coupled over lines 19 and 20 to an input signal. Transducers 15 and 16 function to convert electrical energy on lines 17 and 18 or 19 and 20 into surface acoustic wave energy. Transducer 15 may, for example, have electrodes 21 and 22 each including a plurality of spaced, generally parallel, electrically conductive, interconnected members or fingers 23 and 24, respectively, formed in a suitable manner on the surface 14 of substrate 12. The members or fingers 23 of electrode 21 extend intermediate adjacent of the members or fingers 24 of electrode 22. The center-to-center spacing shown by 25 between adjacent fingers 23 and 24, the interdigital spacing, is typically on the order of one-half an acoustic wavelength $\lambda$ of a surface wave in the acoustic substrate 12.

Input transducers 15 and 16 launch surface acoustic waves towards a first filter 27 having a first plurality of spaced-apart taps 28a through 28k coupled together for providing a first output signal on lines 29 and 30. Each tap 28a through 28k of first filter 27 comprises two electrically conductive fingers 31a and 32a through 31k and 32k which are positioned transverse to the direction of the propagation of surface acoustic waves shown by arrow 26 and are generally parallel with respect to each other. The spacing between the fingers 31b and 32b are, for example, constant having a dimension d shown by arrow 33. Fingers 31a through 31k of taps 28a through 28k are coupled to electrode 34 which is coupled to line 29. Fingers 32a through 32k of taps 28a through 28k are coupled to electrode 35 which is coupled to line 30. As shown in FIG. 1 taps 28a through 28k are evenly spaced having a center-to-center spacing of 1. The number of taps in filter 27, and the spacing between the taps, 1, is predetermined to provide a predetermined filter characteristic.

A second filter 37 comprising a plurality of spaced-apart taps 38a through 38k which are coupled together for providing a second output signal on lines 29 and 42. Taps 38a through 38k are comprised of fingers 41a and 42a through 41k and 42k which are spaced apart and generally parallel to one another and transverse to the propagation direction of surface acoustic waves. Fingers 41a and 42a through 41k and 42k are electrically conductive and have a center-to-center spacing a. Fingers 41a through 41k are coupled to electrode 34 and fingers 42a through 42k are coupled to electrode 45. At least two of taps 38 are positioned in spaces between taps 28.

Figure 2:
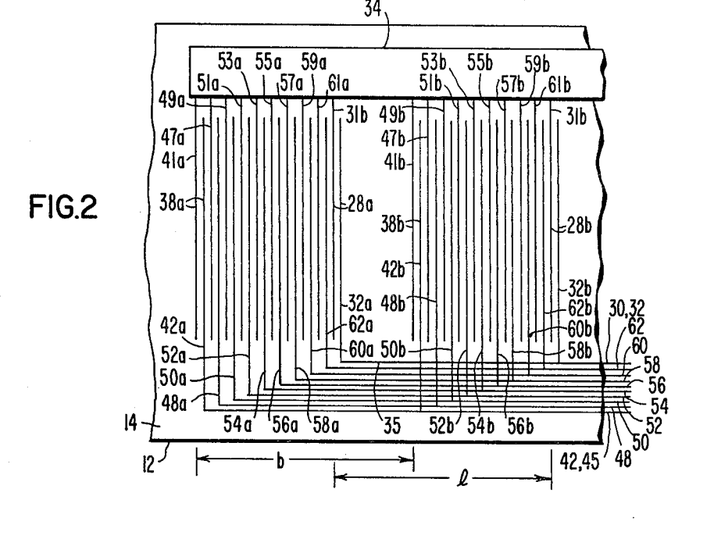
FIGS. 2 and 3 are enlarged views of portions of FIG. 1.
Figure 3:
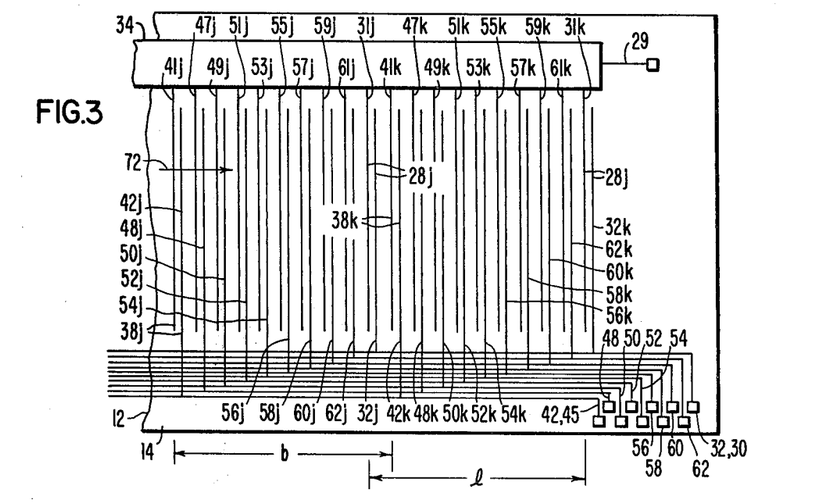

Taps 38a through 38k may, for example, be evenly spaced on upper surface 14 with specific tap positions being located between or among taps 28a through 28k. As many as one hundred ten such taps forming ten filters of eleven taps each can co-occupy the same space as shown in FIG. 1. FIGS. 2 and 3 show enlarged views of portions of FIG. 1.

In FIG. 2, fingers 41a and 42a associated with tap 38a are shown. Also fingers 31a and 32a associated with tap 28a are shown. Tap 38a is spaced apart a distance B from tap 38b comprising fingers 41b and 42b. Tap 28a is spaced apart a distance l from tap 28b comprising fingers 31b and 32b. Between taps 38a and 28a are located other taps associated with fingers 47 through 62 wherein fingers 47 and 48 form a tap, fingers 49 and 50 form another and so forth. Fingers 47 through 62 form a total of eight taps each having a predetermined position on upper surface 14 and each operating independently of the other taps. Fingers 47 through 62 are each electrically conductive and are positioned transverse to the direction of surface acoustic waves. Associated with fingers 47a through 62a are fingers 47b through 62b to form taps in like manner but each positioned a predetermined distance away from its corresponding tap formed by fingers 47a through 62a. An example of actual tap spacing for an eleven-tap comb filter is shown in Table 1. Each tap of a respective filter has an even separation between adjacent taps. In Table I a total of ten comb filters are positioned on a substrate. The comb filters may, for example, be responsive to the frequencies of 200, 201 through 209 MHz.

In FIG. 3 fingers 31i and 32i associated with tap 28i are shown. A distance l further along in the path of propagation of a surface acoustic wave, fingers 31j and 32j form tap 28j as shown in FIG. 3. A distance l further along in the direction of propagation as shown by arrow 72 is fingers 31k and 32k associated with tap 28k. An example of the positioning of taps 28i, j and k are shown in Table I where the positions are given in microseconds. Tap 28i is positioned at 0.8 microseconds, tap 28j is positioned at 0.9 microseconds and tap 28k is positioned at 1.0 microseconds. The distance l according to Table I would be 0.1 microseconds. The time in microseconds is the time for a surface acoustic wave to travel in the substrate medium to arrive at the next tap.

In FIG. 3 fingers 61j and 62j associated with tap 63j are shown and fingers 61k and 62k associated with tap 63k are shown. In likewise manner, fingers 59j and 60j are shown to form tap 64j and fingers 59k and 60k are shown to form 64k. Fingers 57j and 58j associated with tap 65j and fingers 57k and 58k to form tap 65k are shown.

TABLE I

| Taps | Fingers | Peak Amplitude | TAP POSITIONS IN MICROSECONDS (A-K) ||||||||||| 
| | | | A | B | C | D | E | F | G | H | I | J | K |
|---|---|---|---|---|---|---|---|---|---|---|---|---|---|
| 28 | 31,32 | 200 MHz | 0 | .1 | .2 | .3 | .4 | .5 | .6 | .7 | .8 | .9 | 1.0 |
| 63 | 61,62 | 201 | −.005 | .0945 | .194 | .2935 | .393 | .4925 | .592 | .6915 | .791 | .8905 | .990 |
| 64 | 59,60 | 202 | −.010 | .089 | .188 | .287 | .386 | .485 | .584 | .683 | .782 | .881 | .980 |
| 65 | 57,58 | 203 | −.015 | .0835 | .182 | .2805 | .379 | .4775 | .5763 | .675 | .7735 | .872 | .970 |
| 66 | 55,56 | 204 | −.020 | .0780 | .1761 | .2741 | .3722 | .4702 | .5682 | .6663 | .7643 | .8624 | .9604 |
| 67 | 53,54 | 205 | −.025 | .0726 | .1701 | .2677 | .3652 | .4628 | .5604 | .6579 | .7555 | .8530 | .9507 |
| 68 | 51,52 | 206 | −.050 | .0671 | .1642 | .2613 | .3583 | .4554 | .5525 | .6496 | .7467 | .8438 | .9409 |
| 69 | 49,50 | 207 | −.035 | .0616 | .1582 | .2549 | .3515 | .4481 | .5447 | .6413 | .7379 | .8346 | .9312 |
| 70 | 47,48 | 208 | −.040 | .0562 | .1523 | .2485 | .3446 | .4408 | .5369 | .6331 | .7292 | .8254 | .9215 |
| 38 | 41,42 | 209 | −.045 | .0507 | .1464 | .2421 | .3378 | .4335 | .5292 | .6249 | .7206 | .8162 | .9119 |

Fingers 55 and 56 associated with taps 66j and 66k are shown. Fingers 53 and 54 associated with taps 67j and 67k are shown. Fingers 51 and 52 associated with taps 68j and 68k are shown. Fingers 49 and 50 associated with taps 69j and 69k are shown. Fingers 47 and 48 associated with taps 70j and 70k are shown and fingers 41 and 42 associated with taps 38j and k are shown. The distance between taps 38j and 38k is shown in FIG. 3 as dimension b.

The velocity of surface acoustic waves in meters per second in various substrate material such as quartz, lithium niobate, lithium tantalate and bismuth germanium oxide is shown in Table II. Also in Table II the distance that a surface acoustic wave travels in various mediums in 1 nanosecond is provided where the distance is given in micrometers. The distance that a surface acoustic wave will propagate in various substrate mediums is also provided for a 5-nanosecond period where the distance is given in micrometers.

TABLE II

| | Velocity meters/sec | Distance Traveled ||
| | | in 1 NS (micrometers) | in 5 NS (micrometers) |
|---|---|---|---|
| Quartz (ST) X Propagation | 3158 | 3.158 | 15.79 |
| Lithium Niobate Y Cut Z Propagation | 3488 | 3.488 | 17.44 |
| Lithium Tantalate Z Cut Y Propagation | 3229 | 3.229 | 16.45 |
| Bi$_{12}$G$_e$O 001 cut 110 Propagation | 1681 | 1.681 | 8.405 |

Figure 4:
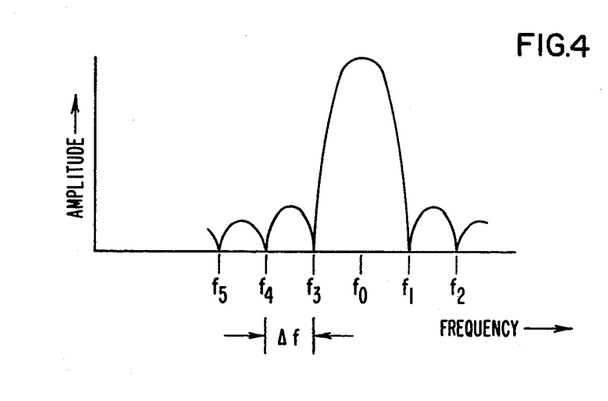
FIG. 4 is a graph of the frequency response of a filter having equally spaced taps.

FIG. 4 is a graph of the frequency response of a filter having equally spaced taps responsive to surface acoustic waves on a substrate. In FIG. 4 the ordinate represents amplitude and the abscissa represents frequency. The amplitude response as a function of frequency is shown in FIG. 4 by curve 74. The amplitude response for a filter having a plurality of n equally spaced taps is given in equation (1):

$$F(w) = \frac{\sin N\phi/2}{\sin \phi/2} = \frac{\sin \frac{\pi[f - f_o]}{\Delta f}}{\sin \frac{\pi[f - f_o]}{N\Delta f}} \quad (1)$$

In equation (1) $\phi = \omega/N\Delta f$; $\omega = 2\pi f$ and N is equal to the number of taps. The amplitude response is well known in the art as a sin X/X pattern which provides a first amplitude null point shown in FIG. 4 at frequencies $f_1$ and $f_3$ a distance $\Delta f$ from frequency $f_o$. The spacing from $f_o$ to the first null points is given by $1/\tau$ where $\tau$ is equal to the delay between the first and $n^{th}$ tap of the filter. $1/\tau$ is equal to $\Delta f$ which is equal to $f_o - f_3$ or $f_1 - f_o$.

As shown in FIG. 4 the amplitude null points at frequencies $f_1$ through $f_5$ are evenly spaced having a separation $\Delta f$ between null points. Since the physical location of the taps on substrate 12 shown in FIG. 1 is evenly spaced or equally spaced, the space on substrate 14 between taps 28a through 28k, for example, can be used for additional taps such as taps 63a through 63k through 70a through 70k and 38a through 38k to form additional filters having null points dependent upon the first and $n^{th}$ tap spacing for each series of evenly spaced taps commonly connected.

The center frequency $f_o$ is determined by the distance between adjacent taps a through k which must be an integral number of wavelengths.

Figure 5:
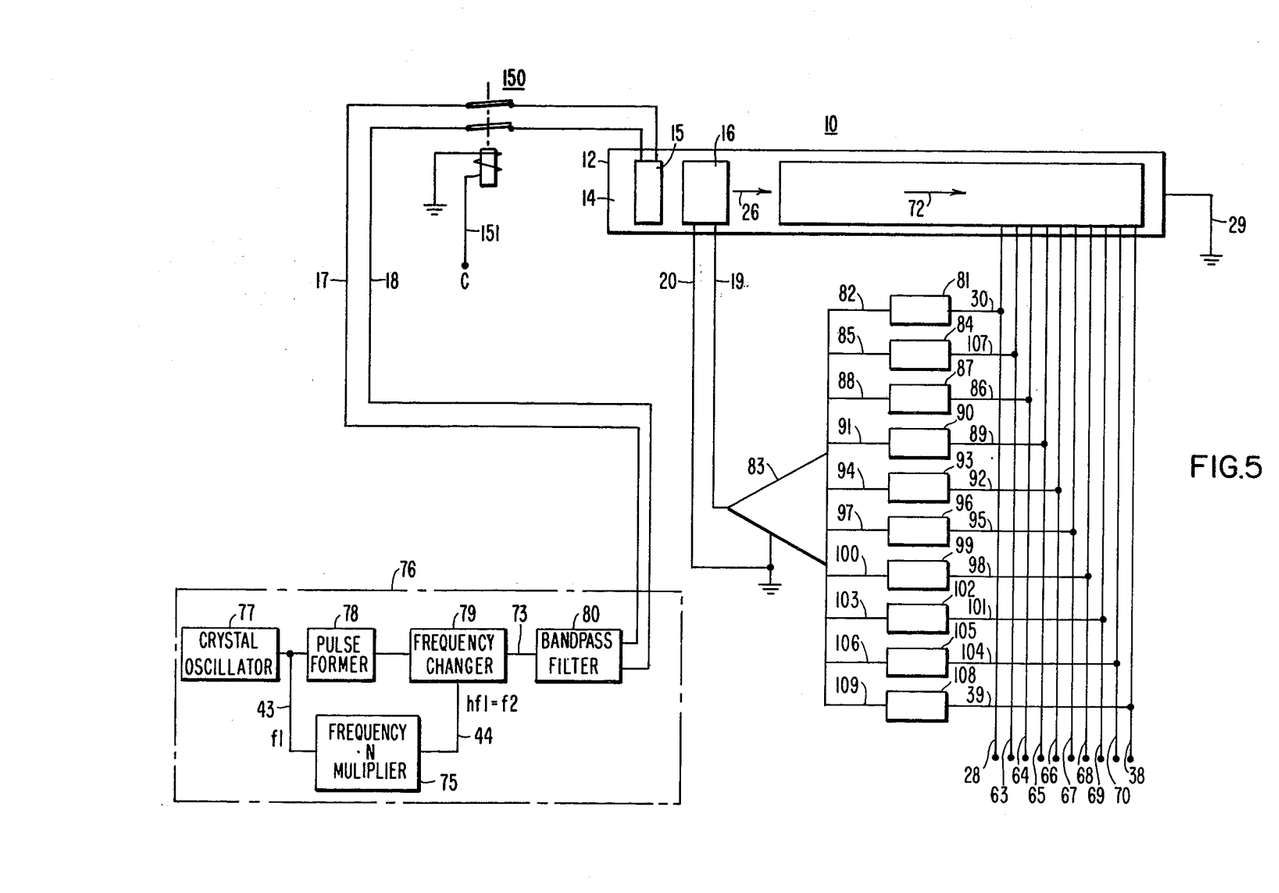
FIG. 5 is a block diagram of another embodiment of the invention.

FIG. 5 is a block diagram of another embodiment of the invention. In FIG. 5 comb spectrum generator 76 which functions to generate a plurality of evenly spaced frequencies is coupled over line 17 and 18 to input transducer 15 positioned on surface acoustic wave device 10 which is shown in more detail in FIG. 1. An example of a comb spectrum generator 76 may, for example, be a crystal oscillator 77 coupled to a pulse former 78 which provides a plurality of frequencies on line 71 such as $f_1$, $2f_1$, $3f_1$, etc., each frequency being a multiple of the frequency, $f_1$, of the crystal oscillator. The output of the pulse former 78 is coupled over line 71 to an input of frequency changer 79. The output of frequency changer 79 is coupled over line 73 to an input of band-pass filter 79 to provide a band-limited comb spectrum.

The output of crystal oscillator 77 is also coupled over line 43 to an input of frequency multiplier 75. Frequency multiplier 75 functions to multiply the frequency $f_1$ on line 43 by an integer n to provide an output signal on line 44 of frequency $f_2$ where $f_1$ is equal to $f_2$. Frequency multiplier 75 is coupled over line 44 to a second input of frequency changer 79.

Figure 6A:
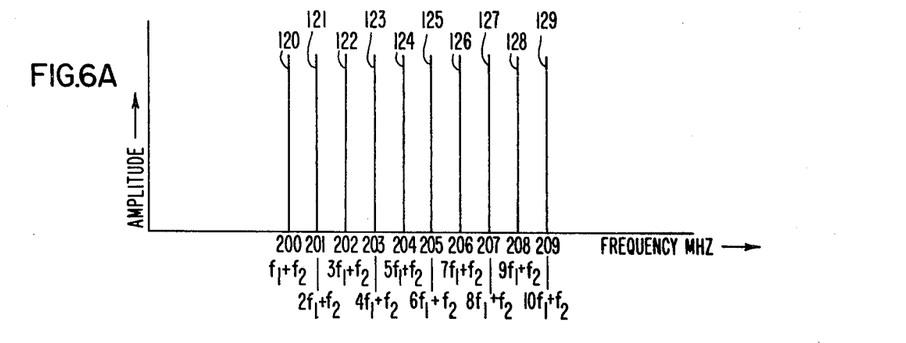
FIG. 6A is a curve of a comb frequency spectrum.

Frequency changer 79 adds the frequency of the signals on lines 44 and 71 to provide the output on line 73 having frequencies such as shown in FIG. 6A of $f_1 + f_2$, $2f_1 + f_2$, $3f_1 + f_2$ etc.

Taps 28a through 28k on surface acoustic wave device 10 are commonly connected together and coupled over line 30 to an input of limiter 81. The output of limiter 81 is coupled over line 82 to an input of amplifier 83. The output of taps 63 are commonly connected together over line 107 to an input of limiter 84. The output of limiter 84 is coupled over line 85 to an input of amplifier 83. The output of taps 64 are coupled over line 86 to an input of limiter 87. The output of limiter 87 is coupled over line 88 to an input of amplifier 83. The output of taps 65 are coupled over line 89 to an input of limiter 90. The output of limiter 90 is coupled over line 91 to an input of amplifier 83. The output of taps 66 are coupled over line 92 to an input of limiter 93. The output of limiter 93 is coupled over line 94 to an input of amplifier 83. The output of taps 67 are coupled over line 95 to an input of limiter 96. The output of limiter 96 is coupled over line 97 to an input of amplifier 83. The output of taps 68 are coupled over line 98 to an input of limiter 99. The output of limiter 99 is coupled over line 100 to an input of amplifier 83. The output of taps 69 are commonly coupled together and coupled over line 101 to an input of limiter 102. The output of limiter 102 is coupled over line 103 to an input of amplifier 83. The output of taps 70 are coupled over line 104 to an input of limiter 105. The output of limiter 105 is coupled over line 106 to an input of amplifier 83. The output of taps 38 are coupled over line 39 to an input of limiter 108. The output of limiter 108 is coupled over line 109 to an input of amplifier 83. Limiters 81, 84, 87, 90, 93, 96, 99, 102, 105 and 108 function to provide amplitude limiting to the signal at its respective input. Amplifier 83 functions to operate as a linear amplifier amplifying the signals on its input lines to provide an output representative of the combination of the input signals each amplified. The output of amplifier 83 is coupled over lines 19 and 20 to an input of input transducer 16.

In operation of the embodiment of FIG. 5, comb spectrum generator 76 generates a band limited comb spectrum such as shown in FIG. 6A by curves 120 through 129. Curve 120 may be, for example, 200 MHz. Curve 121 may be, for example, 201 MHz. Curves 122 through 129 may be, for example, in increments of 1 MHz from 202 MHz to 209 MHz. Transducer 15 functions to launch surface acoustic waves along substrate 12 on surface 14 in a direction shown by arrows 26 and 72.

In FIGS. 6A through 6I, the ordinate represents amplitude and the abscissa represents frequency.

Figure 6B:
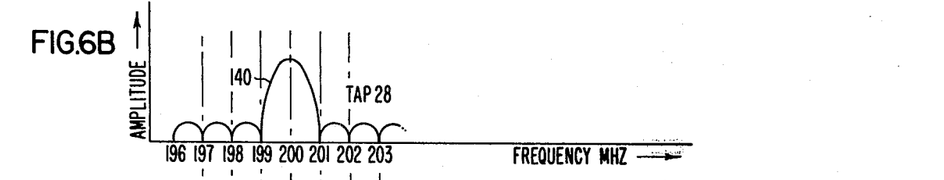
FIGS. 6B through 6E are graphs of the frequency response of a number of filters.

Taps 28a through 28k have a frequency response shown in FIG. 6B having a peak amplitude response at 200 MHz and nulls at 1 MHz spacings from the peak response. The signal from taps 28a through 28k on line 30 is only a 200 MHz frequency signal as shown in FIG. 6F by curve 144. The signal on line 30 is fed through amplitude limiter 81 and through amplifier 83. The output of amplifier 83 which contains the 200 MHz signal is fed to input transducer 16 which launches a 200 MHz surface acoustic signal in direction of arrows 26 and 72. Taps 28a through 28k sense the surface acoustic wave in substrate 12 and recirculate the signal on line 30 through limiter 81 and amplifier 83 to transducer 16 where the electrical signal is relaunched as a surface acoustic wave signal in substrate 12. The time delay in substrate 12 functions to provide a delay line oscillator which is recirculated through line 30, limiter 81, amplifier 83 and transducer 16.

Figure 6C:
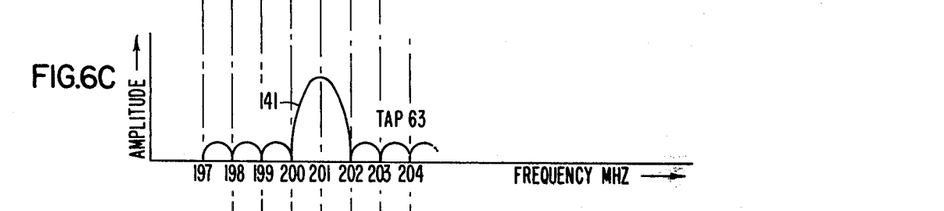

Taps 63a through 63k have a frequency response as shown in FIG. 6C, curve 141, having a peak amplitude response at 201 MHz and nulls at every 1 MHz spaced from the peak amplitude such as at 202 MHz, 203, 204, 200, 199, 198 MHz, etc. The response or signal from taps 63a through 68k are coupled over line 107 through limiter 84 and amplifier 83. The signal on line 107 is shown in FIG. 6G by curve 145 as being only a 201 MHz signal. At the output of amplifier 83 the 201 MHz signal is fed back through transducer 16 where a surface acoustic wave is launched in the direction shown by arrows 26 and 72. Taps 63a through 63k sense the surface acoustic wave at 201 MHz and provide an output again on line 107. The recirculating path through amplitude limiter 84, amplifier 83, transducer 16, substrate 12 and line 107 forms a delay line oscillator.

Figure 6D:
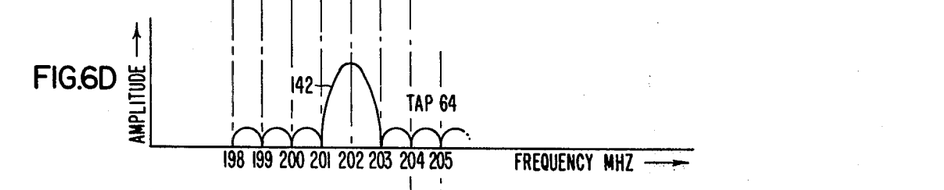
Figure 6E:
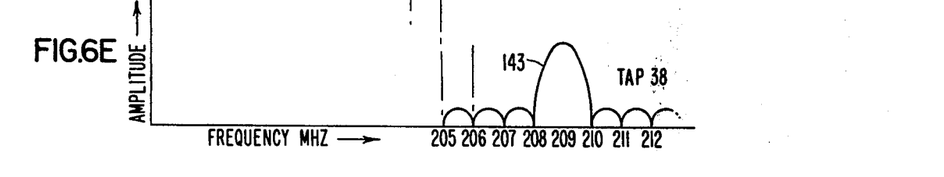
Figure 6F:
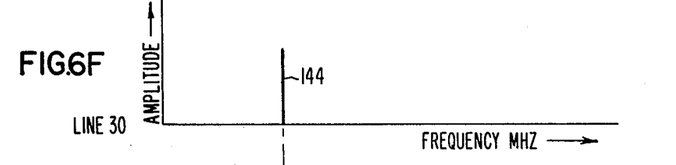
FIGS. 6F through 6I are graphs of the signal output of a number of filters.
Figure 6G:
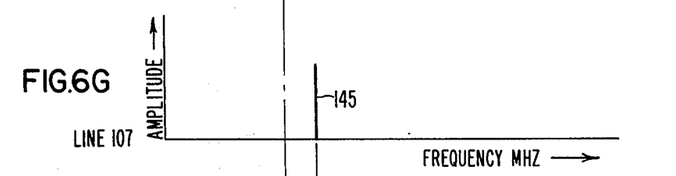
Figure 6H:
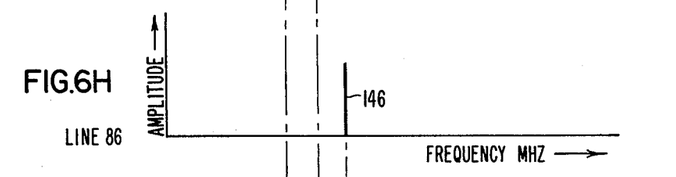

Taps 64a through 64k have a frequency response shown in FIG. 6D, curve 142, having a peak amplitude at 202 MHz with nulls spaced at every 1 MHz from the peak amplitude response such as at 203 MHz, 204, 205, 206, 201, 200, 199 and 198 MHz. The output of taps 64a through 64k are coupled on line 86 through amplitude limiter 87 and amplifier 83. The signal on line 86 is only a 202 MHz signal as shown in FIG. 6H, curve 146. The signal on line 86 is fed through transducer 16 through substrate 12 where taps 64a through 64k sense the 202 MHz signal and provide an output again on line 86. The recirculating path from signal line 86 through substrate 16 and taps 64a through 64k provide a delay line oscillator.

Figure 6I:
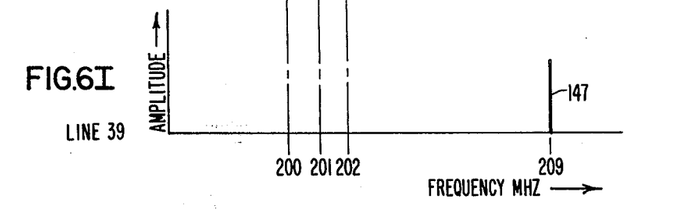

Taps 65a through 65k provide a signal on line 89 having a peak amplitude response at 203 MHz with nulls spaced therefrom at 1 MHz intervals. Taps 66a through 66k provide a frequency response on line 92 having a peak amplitude response at 204 MHz and nulls at 1 MHz intervals therefrom. Taps 67a through 67k provide a frequency response on line 95 having a peak amplitude response at 205 MHz and nulls at 1 MHz intervals therefrom. Taps 68a through 68k provide a frequency response signal on line 98 having a peak amplitude response at 206 MHz and nulls at 1 MHz intervals therefrom. Taps 69a through 69k provide a frequency response having a peak amplitude at 207 MHz and nulls at 1 MHz intervals therefrom, the signal appearing on line 101. Taps 70a through 70k provide a frequency response having a peak amplitude at 208 MHz and nulls at 1 MHz intervals therefrom, the resultant signal appears on line 104. Taps 38a through 38k have a frequency response as shown in FIG. 6E, curve 143, having a peak amplitude response at 209 MHz and nulls at 1 MHz intervals therefrom. The signal from taps 38a through 38k appear on line 39 and is shown in FIG. 6I, curve 147, as being only a 209 MHz signal.

The embodiment in FIG. 5 provides apparatus for providing a plurality of frequencies. A substrate 12 provides propagation time delay and a plurality of filters for occupying the same surface area.

Transducers 15 and 16 may have their functions combined in one transducer by coupling lines 17 and 18 to an input of amplifier 83.

A switch 150 shown in FIG. 5 may be provided to open lines 17 and 18 controlled by control signal C on line 151. Switch 150 is a single-pole, single-throw switch for each line. With switch 150 open, the comb spectrum from comb spectrum generator 76 is removed from substrate 12 and substrate 12 contains only the signals fed back through amplifier 83 to form the recirculating delay line.

The invention describes apparatus for providing a plurality of frequencies comprising a substrate having a surface suitable for propagating surface acoustic waves, a first transducer positioned on said substrate for launching surface acoustic waves, a second transducer positioned on the substrate for launching surface acoustic waves, a first plurality of spaced-apart taps having spaces for selecting a first frequency coupled together for providing a first output signal, a second plurality of spaced-apart taps having spaces for selecting a second frequency coupled together for providing a second output signal, at least two of the second plurality of taps positioned in spaces between the first plurality of taps, means for amplifying the first and second output signals, and means for coupling the amplified signals to the input of the second transducer.

The invention further provides a signal having a comb spectrum of predetermined frequencies coupled to the first transducer.

I claim:

1. Apparatus for providing a plurality of filtered outputs comprising:
    a substrate having a surface suitable for propagating surface acoustic waves,
    an input transducer for launching surface acoustic waves in said substrate,
    a first plurality of evenly spaced-apart taps coupled together for providing a first output signal,
    a second plurality of spaced-apart taps coupled together for providing a second output signal,
    at least two of said second plurality of taps positioned in spaces between said first plurality of taps and wherein the spacing between said first plurality of taps is less than the spacing between said second plurality of taps.

2. Apparatus for providing a plurality of filtered outputs comprising:
    a substrate having a surface suitable for propagating surface acoustic waves,
    an input transducer for launching surface acoustic waves in said substrate,
    a first plurality of spaced-apart taps coupled together for providing a first output signal,
    a second plurality of spaced-apart taps coupled together for providing a second output signal,
    at least two of said second plurality of taps positioned in spaces between said first plurality of taps and a third plurality of spaced-apart taps coupled together for providing a third output signal, at least two of said third plurality of taps positioned in spaces between said first plurality of taps.

3. Apparatus for providing a plurality of frequencies comprising:
    a substrate having a surface suitable for propagating surface acoustic waves,
    a first transducer positioned on said substrate for launching surface acoustic waves,
    a first plurality of spaced-apart taps having spaces for selecting a first frequency coupled together for providing a first output signal,
    a second plurality of spaced-apart taps having tap spacings for selecting a second frequency coupled together for providing a second output signal,
    at least two of said second plurality of taps positioned in spaces between said first plurality of taps,
    means for amplifying said first and second output signals, and
    means for coupling said amplified signals to the input of said first transducer to form a recirculating signal path.

4. The apparatus of claim 3 wherein said first plurality of spaced-apart taps are evenly spaced.

5. The apparatus of claim 4 wherein said second plurality of spaced-apart taps are evenly spaced.

6. The apparatus of claim 4 wherein the spacing between said first plurality of taps is less than the spacing between said second plurality of taps.

7. The apparatus of claim 3 further including a third plurality of spaced-apart taps coupled together for providing a third output signal, at least two of said third plurality of taps positioned in spaces between said first plurality of taps.

8. The apparatus of claim 2 or 7 wherein said third plurality of spaced-apart taps are evenly spaced.

9. The apparatus of claim 3 further including means for amplifying said third output signal.

10. The apparatus of claim 3 further including means for limiting the amplitude of said first and second output signals.

11. The apparatus of claim 3 further including means for coupling an input signal to said first transducer.

12. The apparatus of claim 3 further including a second transducer positioned on said substrate for launching surface acoustic waves and means for coupling an input signal to said second transducer.

13. The apparatus of claim 11 or 12 wherein said input signal includes predetermined frequencies evenly spaced apart.

14. A plurality of delay line oscillators for providing a plurality of frequencies comprising:
    a substrate having a surface suitable for propagating surface acoustic waves,
    a first transducer positioned on said substrate for launching surface acoustic waves,
    a first plurality of spaced-apart taps having spaces for selecting a first frequency coupled together for providing a first output signal,
    a second plurality of spaced-apart taps having tap spacings for selecting a second frequency coupled together for providing a second output signal,
    at least two of said second plurality of taps positioned in spaces between said first plurality of taps,
    means for amplifying said first and second output signals, and
    means for coupling said amplified signals to the input of said first transducer to form a recirculating signal path,
    an input signal having a number of predetermined frequencies evenly spaced apart including said first and second frequencies,
    means for coupling said input signal to said first transducer for injecting said input signal into said recirculating signal path.

15. A plurality of delay line oscillators for providing a plurality of frequencies comprising:
    a substrate having a surface suitable for propagating surface acoustic waves,
    a first transducer positioned on said substrate for launching surface acoustic waves,
    a first plurality of spaced-apart taps having spaces for selecting a first frequency coupled together for providing a first output signal,
    a second plurality of spaced-apart taps having tap spacings for selecting a second frequency coupled together for providing a second output signal,
    at least two of said second plurality of taps positioned in spaces between said first plurality of taps,
    means for amplifying said first and second output signals, and
    means for coupling said amplified signals to the input of said first transducer to form a recirculating signal path,
    a second transducer positioned on said substrate for launching surface acoustic waves,
    an input signal having a number of predetermined frequencies evenly spaced apart including said first and second frequencies,
    means for coupling said input signal to said second transducer for injecting said input signal into said substrate.

* * * * *